United States Patent
Ryu et al.

(10) Patent No.: US 9,281,075 B2
(45) Date of Patent: Mar. 8, 2016

(54) MEMORY PROGRAMMING METHOD AND APPARATUS

(71) Applicant: Magnachip Semiconductor, Ltd., Cheongju-si (KR)

(72) Inventors: Beomseon Ryu, Cheongju-si (KR); Taeil Yun, Cheongju-si (KR); Daeyoung Yoo, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/338,426

(22) Filed: Jul. 23, 2014

(65) Prior Publication Data

US 2015/0070963 A1    Mar. 12, 2015

(30) Foreign Application Priority Data

Sep. 10, 2013    (KR) .................. 10-2013-0108737

(51) Int. Cl.
G11C 17/16    (2006.01)
G11C 17/18    (2006.01)
G11C 13/00    (2006.01)
G11C 17/14    (2006.01)
G11C 29/02    (2006.01)
G11C 29/44    (2006.01)

(52) U.S. Cl.
CPC ............ *G11C 17/16* (2013.01); *G11C 13/0069* (2013.01); *G11C 17/146* (2013.01); *G11C 17/18* (2013.01); *G11C 29/027* (2013.01); *G11C 2013/0076* (2013.01); *G11C 2013/0083* (2013.01); *G11C 2029/4402* (2013.01)

(58) Field of Classification Search
CPC .................................. G11C 17/16; G11C 7/222
USPC ................................ 365/96, 189.05
See application file for complete search history.

(56) References Cited

U.S. PATENT DOCUMENTS

| | | | |
|---|---|---|---|
| 6,560,670 B1 * | 5/2003 | Ichiriu ................. | G11C 15/00 365/230.03 |
| 7,852,656 B2 | 12/2010 | Shin et al. | |
| 7,880,211 B2 | 2/2011 | Shin et al. | |
| 7,983,096 B2 * | 7/2011 | Kuroki .................. | G11C 7/24 365/185.04 |
| 8,513,770 B2 | 8/2013 | Shin et al. | |
| 8,644,093 B2 | 2/2014 | Hiraide | |
| 2010/0131808 A1 * | 5/2010 | Chen et al. ................. | 714/719 |
| 2010/0257327 A1 * | 10/2010 | Kosugi ........................ | 711/162 |
| 2011/0225471 A1 * | 9/2011 | Shore ............................ | 714/719 |
| 2013/0117633 A1 * | 5/2013 | Matsukawa et al. .......... | 714/763 |
| 2013/0182496 A1 * | 7/2013 | Hoya ............................ | 365/158 |

* cited by examiner

*Primary Examiner* — Michael Tran
(74) *Attorney, Agent, or Firm* — NSIP Law (57) ABSTRACT

The memory programming apparatus includes a memory reader configured to read a read data in a plurality of cells related with an address of a programmable memory; and a memory writer configured to record a write data on the plurality of cells to compare the write data with the read data, to generate a re-writing pattern, and to correct at least one mismatch cell among the plurality of cells. Accordingly, it may be possible to reduce a programming processing time and to increase a yield rate.

13 Claims, 5 Drawing Sheets

MEMORY PROGRAMMING METHOD AND APPARATUS

CROSS-REFERENCE TO RELATED APPLICATIONS

This application claims the benefit under 35 USC 119(a) of Korean Patent Application No. 10-2013-0108737 filed on Sep. 10, 2013, in the Korean Intellectual Property Office, the entire disclosure of which is incorporated herein by reference for all purposes.

BACKGROUND

1. Field

The following description relates to a memory programming method and apparatus, and to a multi-bit programming method for a one-time programmable memory and apparatus.

2. Description of Related Art

A one time programmable (OTP) memory includes a plurality of OTP unit cells, the cells being arranged in row and column directions.

The OTP unit cell is formed in a volatile or nonvolatile memory element such as a dynamic random-access memory (DRAM), an electrically erasable programmable read-only memory (EEPROM) or a FLASH to be used for a memory repair. In addition, in a mixed-signal chip mixing an analog chip and a digital chip, the OTP unit cell is used for trimming an inner operating voltage and a frequency.

In general, the OTP unit cell includes an anti-fuse formed of a MOSFET (Metal-Oxide-Semiconductor Field Effect Transistor, hereinafter, referred to as an MOS transistor) and at least one MOS transistor. The OTP unit cell is formed of a single or an array in each of memory, thereby being used in the repair or trimming.

The Korean Registration Patent No. 10-0845407 (Jul. 3, 2008) relates to a one-time-programmable cell and a OTP memory having the same, implementing fewer MOS transistor so that it may have a smaller area and a shorter access time, and having an inverter type sense amplifier so that it may be possible to reduce leakage current and area.

The Korean Registration Patent No. 10-1051673 (Jul. 19, 2011) relates to an anti-fuse, a forming method thereof, and a unit cell of a nonvolatile memory device having the same, capable of causing a stable breakdown of a gate dielectric layer of the anti-fuse formed of a MOS transistor, so that a data sensing margin during a reading operation is improved and then an operation reliability may be enhanced.

Figure 1:
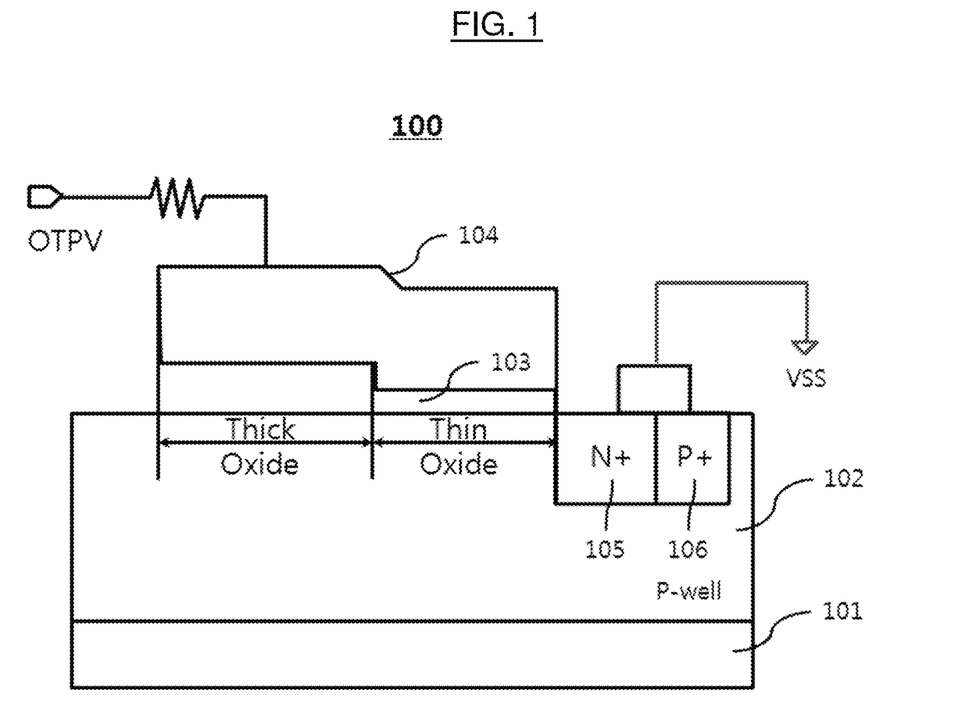
FIG. 1 is a diagram illustrating an example of an OTP memory programming method.

FIG. 1 is a cross-sectional diagram illustrating an OTP memory programming method in conventional art. Referring to FIG. 1, the OTP memory programming scheme is performed by providing a high voltage (i.e., OTPV) to an anti-fuse (e.g., CMOS anti-fuse) of an OTP unit cell 100 and breaking a CMOS gate insulating layer (e.g., Gate Oxide) 103 to decrease a resistance value between a gate 104 and a substrate 101 to a specific resistance value (e.g., several M Ohm).

The anti-fuse of the OTP unit cell 100 includes a gate electrode 104 formed on the substrate 101, the junction area 105 formed in the substrate that is exposed to a side wall direction of the gate electrode 104 and the gate insulating layer 103 formed between the gate electrode 104 and the substrate 101 in a comparatively thin thickness.

The junction area 105 and a pick-up area 106 (i.e., an area providing a bias to a well 102) are interconnected with each other, and are connected with a ground voltage terminal VSS. Further, a writing voltage OTPV is provided to the gate electrode 104 through a metal wiring. Therefore, a high electric field is formed between the gate electrode 104 and the substrate 101 to break the gate insulating layer 103 and to electrically short the gate electrode 104 and the substrate 101.

The OTP memory programming scheme in the art includes writing data, reading data written on the OTP memory and comparing the written data with data to be written. Also, the OTP memory programming scheme in the art repeatedly performs those procedures until a test of all bits in the OTP memory passes (i.e., the written data matches up with the data to be written). For example, when a writing procedure is performed on 8-bit unit cells of the OTP memory, if the test of all of 8-bit data in the OTP memory does not pass, then a re-writing procedure is performed again on all of the 8-bit data.

High current energy is concentrated on a path in which gate insulating layer was broken so that energy concentration is comparatively reduced for the unit cell whose gate insulating layer was not broken. Therefore, the writing procedure takes long time and a yield rate is reduced because a breaking of the insulating layer is not properly performed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one aspect, there is provided a memory programming apparatus including a memory reader configured to read a read data in a plurality of cells related with an address of a programmable memory, and a memory writer configured to record a write data on the plurality of cells, to compare the write data with the read data, to generate a re-writing pattern, and to correct at least one mismatch cell among the plurality of cells.

The memory reader may be further configured to perform a re-reading operation on a re-read data in the plurality of cells using the address, in response to correcting the mismatch cell.

The memory writer may be further configured to update the re-writing pattern using the re-read data to perform a re-correcting operation on at least one re-mismatch cell.

The memory reader and the memory writer may sequentially repeat the re-reading operation and the re-correcting operation until an error does not occur in contents recorded on the plurality of cells.

The memory writer may be further configured to generate a mask data based on the read data, and the memory writer further comprises a re-writing pattern generator configured to perform a logical AND operation between the mask data and the write data to generate a re-writing pattern.

The memory writer may include a re-writing pattern storing module configured to store the re-writing patterns.

The memory writer may include a voltage generator configured to generate a fusing voltage, and a voltage provider configured to provide the fusing voltage to the at least one mismatch cell based on the re-writing pattern.

The voltage provider may include a plurality of switches configured to be controlled based on the re-writing pattern and to provide the fusing voltage to the plurality of cells.

The apparatus may include a controller configured to count a number of the re-correcting operation and to determine whether the repetition number exceeds a count.

The apparatus may include an address decoder configured to receive a programming data and to extract cell selecting information associated with a specific address of a memory.

The controller may be configured to enables the address decoder to receive the programming data, to extract different cell selecting information in response to an absence of an error in the contents written on the plurality of cells or the number of operation exceeding the count, and to update a write data for the address.

The controller may be configured to control the memory reader, memory writer, and the address decoder based on a clock signal and the re-writing pattern.

The fusing voltage provided to the plurality of cells may vary from 7.5V to 8V.

The count may be varied based on an applied product.

In another general aspect there is provided a memory programming method including writing a write data on a plurality of cells related with an address of a programmable memory, reading a read data in the plurality of cells, generating a re-writing pattern based on comparison of the write data with the read data to, and correcting at least one mismatch cell among the plurality of cells.

The generating of the re-writing pattern may include performing an XOR (exclusive OR) operation on the write data and the read data to generate a mask data, and performing an AND operation on the generated mask data and the write data to generate the re-writing pattern.

The writing of the write data may include testing for an operating parameter before the writing of the write data.

In another general aspect there is provided a programmable memory tester including a memory container configured to contain a programmable memory, and a memory programming apparatus configured to program the memory, the memory programming apparatus comprising a memory reader configured to read a read data in a plurality of cells related with an address of a programmable memory, and a memory writer configured to record a write data on the plurality of cells, to compare the write data with the read data, to generate a re-writing pattern, and to correct at least one mismatch cell among the plurality of cells.

In another general aspect there is provided a memory programming method and apparatus capable of reducing a memory programming processing time and increasing a yield rate.

In another general aspect there is provided a memory programming method and apparatus capable of controlling a memory programming loop.

In another general aspect, there is provided a memory programming technology to reduce a memory programming processing time and increase a yield rate by generating and updating a re-writing pattern.

In another general aspect, there is provided a memory programming technology to control a memory programming loop by performing a comparison operation between write data and written data.

Other features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses, and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be understood that when an element is referred to as being "connected to" another element, it can be directly connected to the other element or intervening elements may also be present. In addition, unless explicitly described to the contrary, expressions describing relationships between components such as, for example, "~ between", "immediately ~ between" or "adjacent to ~" and "directly adjacent to ~" may be construed to imply the inclusion of stated elements but not the exclusion of any other elements.

Figure 2:
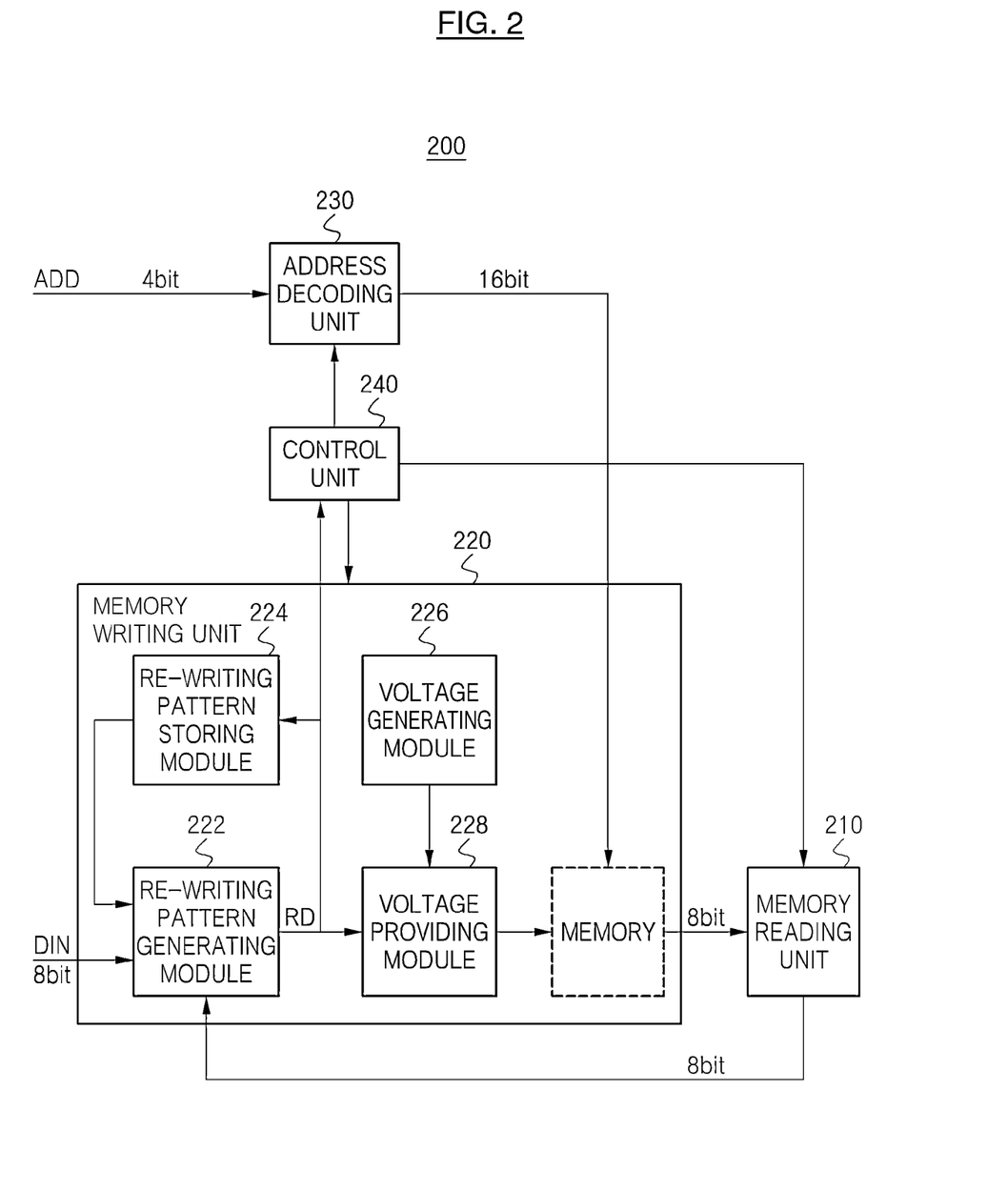
FIG. 2 is diagram illustrating an example of a memory programming apparatus.

FIG. 2 is diagram illustrating an example of a memory programming apparatus 200. Referring to FIG. 2, the memory programming apparatus 200 includes a memory reading unit 210, a memory writing unit 220, an address decoding unit 230, and a control unit 240.

The memory reading unit 210 reads a data in a plurality of cells related with a specific address of a programmable memory. The programmable memory may correspond to the OTP memory described above and the read data corresponds to the data written in the specific address of the memory.

In one example, when a write data is written in the memory, the memory reading unit 210 may perform a re-reading operation to re-read data in the plurality of the cells using the specific address of the memory. A re-reading operation refers to an operation to read again written data of the same address.

The memory reading unit 210 may sense a voltage between a CMOS gate in each of the OTP memory unit cells described above and a ground terminal GND. The memory reading unit 210 may compare the voltage with a reference voltage to output the comparison result.

The memory writing unit 220 records a write data on the plurality of cells related with the specific address of the programmable memory, compares the write data with the read data received from the memory reading unit 210, generates a re-writing pattern and corrects at least one mismatch cell among the plurality of cells.

For example, the memory writing unit 220 receives the write data from the outside for predetermined 8 cells of the specific address of the memory and records the write data on the corresponding cells. When the write data and the read data received from the memory reading unit 210 are mismatched, the memory writing unit 220 may generate a re-writing pattern (i.e., the re-writing pattern corresponds to unwritten data among the expected write data) to re-record the data. Generating the re-writing pattern may be performed on updating the write data.

In one example, the memory writing unit 220 may perform a re-correcting operation that updates the re-writing pattern through the re-reading data to correct at least one mismatch cell.

The memory writing unit 220 may compare the re-writing pattern with the re-reading data to update the un-written portions among the re-writing pattern to be another re-writing pattern. The memory writing unit 220 may record on the corresponding cell where the re-writing pattern is not recorded.

In one example, the memory reading unit 210 and the memory writing unit 220 may sequentially repeat a re-reading operation and a re-correcting operation until an error does not occur in contents recorded in the plurality of cells.

The memory reading unit 210 and the memory writing unit 220 may repeatedly perform recording and reading the written data until an initial writing data is recorded in the memory.

In another example, the memory reading unit 210 and the memory writing unit 220 may sequentially repeat the re-reading operation and the re-correcting operation within a predetermined number (max count). The predetermined number may be varied according to an applied product and this variation may be known to those skilled in the art.

The memory programming apparatus 200 according to one example may record the write data only on the cell where the write data is not written so that the programming time is reduced and the yield rate is increased.

In one example, the memory writing unit 220 may generate a mask data based on the read data and include a re-writing pattern generating module 222 that generates a re-writing pattern by performing a logical AND operation between the mask data and the write data.

The re-writing pattern generating module 222 receives the write data form the outside and the read data from the memory reading unit 210 and compares the write data and the read data with each other to generate the re-writing pattern.

For example, when the write data and the read data correspond to [11110000] and [11000000], respectively as 8-bit binary data, the re-writing pattern generating module 222 may generate the re-writing pattern [00110000] through a following method. An XOR (exclusive OR) operation may be performed on the write data [11110000] and the read data [11000000] to generate the mask data [00110000]. The generated mask data may perform an AND operation with the write data to generate re-writing pattern [00110000]. As a result, when a bit of the read data corresponds to [1], a corresponding re-writing pattern may generate [0] and when a bit of the read data corresponds to [0], a corresponding re-writing pattern may hold the write data bit of the corresponding bit. Therefore, the re-writing pattern may generate [00110000].

As another example, the re-writing pattern generating module 222 may generate the mask data [00111111] through inverting the read data and perform a logical AND operation for the mask data [00111111] and the write data [11110000] to generate the re-writing pattern [00110000].

In one example, the memory writing unit 220 may further include a re-writing pattern storing module 224 to store the generated re-writing pattern. The re-writing pattern storing module 224 may temporarily store the re-writing pattern, and the stored re-writing pattern may be used for generating the re-writing pattern of the following loop.

In one example, the re-writing pattern generating module 222 may receive the re-writing pattern from the re-reading pattern storing module 224 and re-read data from the memory reading unit 210. The re-writing pattern generating module 222 may compare the re-writing pattern and the re-read data to update the re-writing pattern.

The re-writing pattern generating module 222 may generate the re-writing pattern corresponding to the updated write data by comparing the write data with the read data, may re-record the write data for the memory, and may compare the stored re-writing pattern (i.e., the updated write data) with the re-read data (i.e., data recorded on the memory) to update the re-writing pattern (i.e., re-updating the updated write data).

The re-writing pattern generating module 222 repeatedly generates and updates the re-writing pattern based on the repeated re-reading operation and the re-correcting operation on the memory writing unit 220 as described above.

In one example, the re-writing pattern generating module 222 may further include a write data selection module (not shown).

The re-writing pattern generating module 222 may receive the re-writing pattern stored in the re-writing pattern storing module 224 to compare the re-writing pattern with the read data. The re-writing pattern generating module 222 may include the read data selection module (not shown) to select one of the write data or the re-writing pattern, in order to compare the write data with the read data when the write data is received from the outside.

In one example, the memory writing unit 220 may further include a voltage generating module 226 generating a fusing voltage and a voltage providing module 228 providing the generated fusing voltage to at least one mismatch cell based on the re-writing pattern.

The memory writing unit 220 may include the voltage generating module 226 and the voltage providing module 228. The voltage generating module 226 generates the fusing voltage to be provided to an OTP memory unit cell according to an OTP memory programming method, and the voltage providing module 228 provides the fusing voltage to corresponding cell including data based on the write data pattern or the re-writing pattern (i.e., updated write data).

Here, the fusing voltage may be about 8 V and a fusing voltage being provided to the unit cells may be 7.5 V through 8 V depending on arrangement of unit cells (and parasitic resistance).

In one example, the voltage providing module 228 may include a plurality of switches that is controlled by the re-writing pattern (or the write data) and provides the fusing voltage to the plurality of the cells. Each of the plurality of switches may connect the OTP memory unit cells and the voltage generating module 226.

The address decoding unit 230 receives programming data from the outside to extract cell selecting information associated with the specific address of the memory. For example, when the memory corresponds to the OTP memory including 8 row*16 column unit cells, the address decoding unit 230 may receive the programming data (e.g., 4-bit) including address information for the specific cells of the memory from the outside to decode the 16-bit cell selecting information to select a corresponding memory.

The address decoding unit 230 may provide the corresponding cell selecting information to the memory writing unit 220, and the memory writing unit 220 may select the cells of the specific address associated with the cell selecting information to record the writing data.

The control unit 240 controls the memory reading unit 210, the memory writing unit 220 and the address decoding unit 230 based on a clock signal and a re-writing pattern. The clock signal may correspond to a square wave and may be received from outside or be generated in the control unit 240.

The control unit 240 may receive the re-writing pattern generated in the memory writing unit 220 to determine whether the received re-writing pattern corresponds to a specific data. If the re-writing pattern corresponds to a specific data, the control unit 240 may cause the memory writing unit 220 to terminate recording the data corresponding to the specific address.

For example, when an 8-bit re-writing pattern generated in the memory writing unit 220 corresponds to [00000000], the control unit 240 may determine that the write data (or the stored re-writing pattern) is matched up with the read data. Here, the control unit 240 may determine that the first write data is properly programmed in the corresponding address of the OTP memory to terminate the programming for the address.

In one example, when the re-writing pattern generated in the memory writing unit 220 does not correspond to a specific data, the control unit 240 may cause the memory reading unit 210 and the memory writing unit 220 to repeatedly perform the reading operation and the correcting operation.

In one example, the control unit 240 may count the number of repetition (max count) for the correcting operation (or re-correcting operation) of the memory writing unit 220. When a repetition number exceeds the predetermined number, the control unit 240 may terminate recording the data associated with the address. The predetermined number may correspond to a number determined by user of the memory programming apparatus 200.

The memory programming apparatus 200 may control the processing time extended due to the repeated re-reading operation and the re-correcting operation until error does not occur in contents recorded on the plurality of cells.

In one example, when an error does not occur in the contents recorded on the plurality of cells or the repetition number of operation exceeds the predetermined number (max count), the control unit 240 may cause the address decoding unit 230 to receive the programming data, to extract other cell selecting information, and the memory writing unit 220 to update recording data for the predetermined address.

When the error does not occur in contents recorded on the plurality of the cells or the repetition number of operation exceeds the predetermined number, the control unit 240 may terminate recording of the recording data associated with the address and may control the address decoding unit 230 and the memory writing unit 220 in order to record a write data for a different address.

Figure 3:
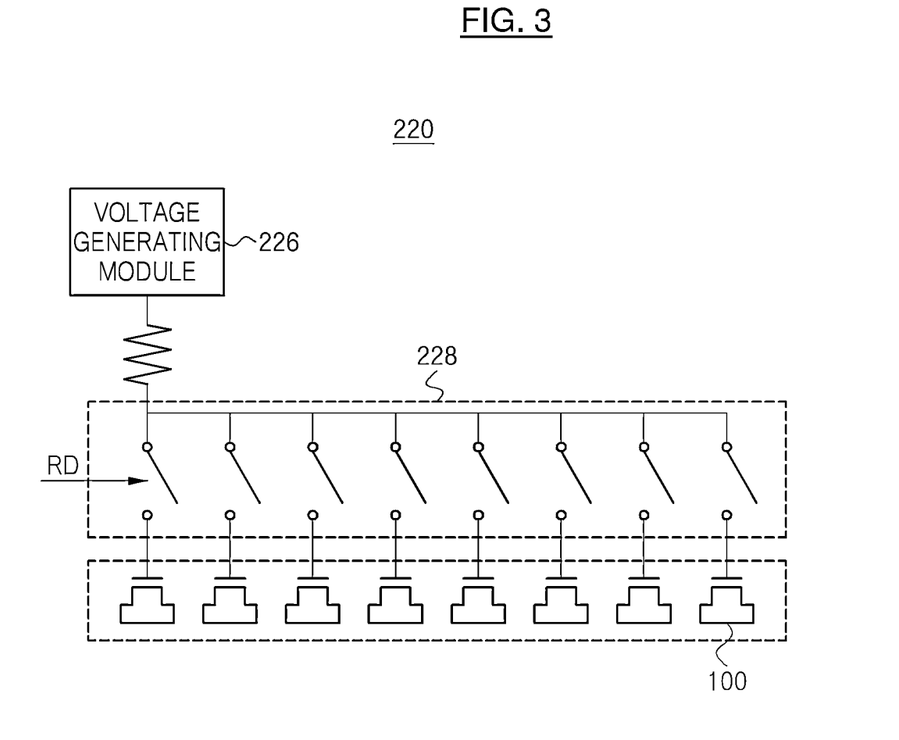
FIG. 3 is a diagram illustrating an example of an operation of a memory programming apparatus shown in FIG. 2.

FIG. 3 is a diagram illustrating an example of an operation of a memory programming apparatus 200 shown in FIG. 2. Referring to FIG. 3, the data recording unit records write data in a scheme to fuse unit cells of the OTP memory by 8 bit unit, and includes the voltage generating module 226 and the voltage providing module 228.

The voltage generating module 226 generates a fusing voltage of 8 V and the voltage providing module 228 may include 8 switches connecting the voltage generating module 226 with 8 unit cells. The switches operate according to the write data (or a re-writing pattern, RD) to be recorded in each of the plurality of unit cells. For example, when the write data to be recorded in the corresponding unit cell is [1], a switch turns on and when the write data to be recorded in the corresponding unit cell is [0], the switch keeps a turned off state.

In an example, in FIG. 3, when the write data is [00101100], the voltage providing module 228 turns on switches connecting the voltage generating module 226 to the third, fifth and sixth unit cells.

Therefore, the memory programming apparatus 200 may update the re-writing pattern (or the write data) and may provide the fusing voltage only to the unit cell where the write data is not recorded (or is failed or mismatched) so that with the concentrated current energy, the repetition number of the correcting operation (or re-correcting operation) is decreased and the yield rate is increased.

Figure 4:
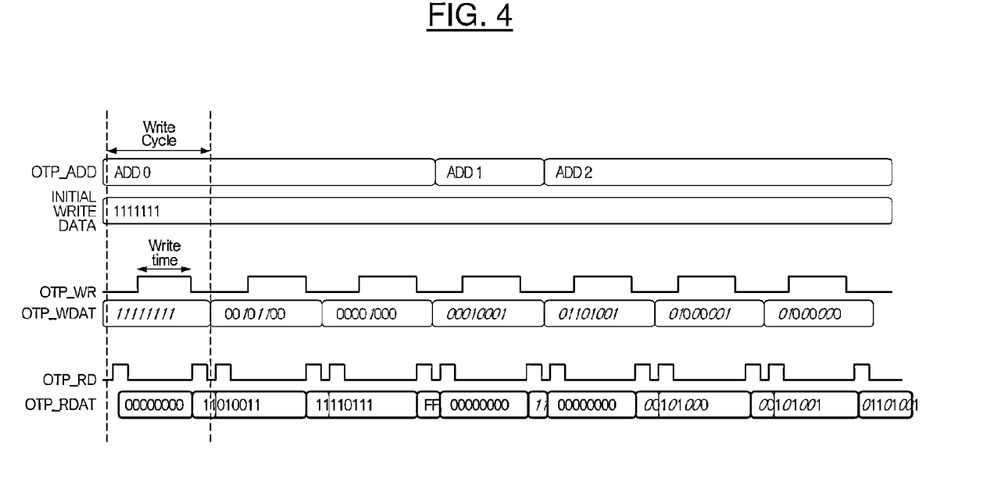
FIG. 4 is a diagram illustrating an example of a timing block diagram of a memory programming method.

FIG. 4 is a diagram illustrating an example of a timing block diagram illustrating a memory programming method shown in FIG. 2.

Referring to FIG. 4, an X-axis indicates a time and an Y-axis indicates an address of the OTP memory OTP_ADD, a write data, an operation pulse of the memory writing unit 220 OTP-WR, a re-writing pattern (or the updated write data) OTP_WDAT, an operation pulse of the memory reading unit 210 OTP_RD, and read data (or the data written on the corresponding unit cells) OTP_RDAT from the top to the bottom direction.

In a first cycle, the memory writing unit 220 receives a specific address [0] and the first write data [11111111]. While the operation pulse level is high, the memory reading unit 210 reads the read data [00000000] associated with the address [0] to provide the read data to the memory writing unit 220.

The memory writing unit 220 compares the first write data [11111111] with the read data [00000000] to generate the re-writing pattern (or updating the write data) and records the write data.

When an operation of the memory writing unit 220 terminates, the memory reading unit 210 reads the data written on the corresponding cells, that is, the read data [11010011].

Here, the memory reading unit 210 may read the read data immediately before terminating the first cycle, immediately after starting the second cycle, or at both times.

In a second cycle, the memory writing unit 220 may compare the re-writing pattern [11111111] with read data [11010011] to update the re-writing pattern to [00101100] and then the memory writing unit 220 may perform recording (or correcting) the re-writing pattern only on unit cells (or mismatch cells) corresponding [1] among the re-writing pattern. The mismatch cells corresponds to third, fifth and sixth unit cells.

The memory reading unit 210 reads the data recorded on the corresponding cells, that is, the read data [11110111].

In a third cycle, the memory writing unit 220 updates the re-writing pattern to [00001000] in the same manner with other cycles and performs the re-correcting operation on the fifth cell. When the memory reading unit 210 reads the read data [11111111], a programming associated with the address terminates. The termination of the corresponding programming may be determined by the control unit 240 as described above.

In a fourth cycle, the control unit 240 may cause the memory writing unit 220 to perform the programming of the second write data [00010001] for a next specific address [1] as described above.

The memory reading unit 210 reads the read data [00000000] in the same manner with the first cycle and the memory writing unit 220 compares the write data with the second write data to update the re-writing pattern to [00010001] and then performs recording the second write data associated with the address, in the same manner as with the first cycle.

When the written data [00010001] is read by the memory reading unit 210, the programming associated with the address [1] terminates.

The fifth cycle and the seventh cycle correspond to a programming procedure of third write data [01101001] for a specific address [2]. The re-writing pattern is updated in order of [01101001], [01000001], and [0100000], and the written data is updated in order of [00101000], [00101001] and [01101001]. The re-reading operation and the re-correcting operation for the corresponding address [2] may be repeatedly performed.

Figure 5:
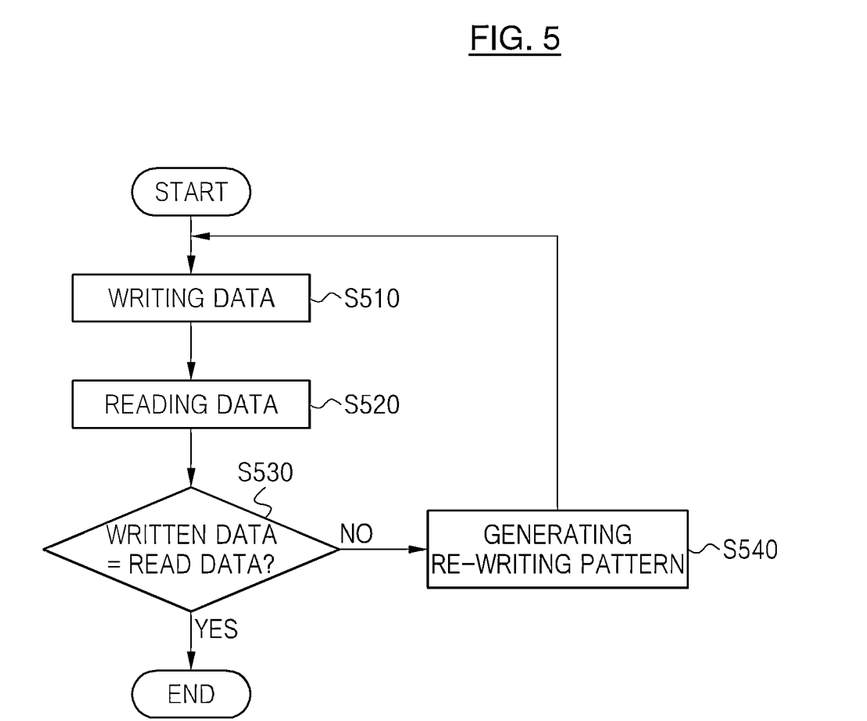
FIG. 5 is a is a diagram illustrating an example of a memory programming method performed on the memory programming apparatus shown in FIG. 2.

FIG. 5 is a flow chart illustrating a memory programming method performed on the memory programming apparatus 200. The operations in FIG. 5 may be performed in the sequence and manner as shown, although the order of some operations may be changed or some of the operations omitted without departing from the spirit and scope of the illustrative examples described. Many of the operations shown in FIG. 5 may be performed in parallel or concurrently. The above description of FIGS. 1-4, is also applicable to FIG. 5, and is incorporated herein by reference. Thus, the above description may not be repeated here.

Referring to FIG. 5, in S510, the memory programming apparatus 200 records the write data on the plurality of cells related with the specific address of the memory. In one example, the memory programming apparatus 200 may perform a pre-test before recording the write data. The pre-test may correspond to a test for an operating parameter (e.g., an operating frequency) of the memory programming apparatus 200.

In another example, the memory programming apparatus 200 may search for the write data after the pre-test. The search of the write data may be performed based on the cell selecting information associated with the specific address decoded by the address decoding unit 230.

In S520, the memory programming apparatus 200 reads the read data in the plurality of cells. In S530, the memory programming apparatus 200 compares the write data with the read data after reading the data. When the comparison result is equal (i.e., the write data are recorded in the plurality of cells without errors), the programming operation for the corresponding plurality of cells terminates.

When the comparison result is not equal, in S540, the memory programming apparatus 200 generates (or updates) the re-writing pattern. The memory programming apparatus 200 corrects the at least one mismatch cell among the plurality of cells based on the re-writing pattern.

The memory programming apparatus 200 may repeatedly perform Steps S510 through S540 until the error does not occur in contents recorded on the plurality of cells.

A memory programming method according to the examples compares the write data with the read data and repeatedly re-writes only unwritten data so that the memory programming method may reduce the processing time and may increase the yield rate in comparison with the conventional memory programming method.

A programmable memory tester includes a memory containing unit containing the programmable memory and the memory programming apparatus 200 performing the memory programming.

All documents cited in the present disclosure, including published documents, patent applications, and patents, may be incorporated herein in their entirety by reference in the same manner as when each cited document is separately and specifically incorporated or incorporated in its entirety.

The systems, processes, functions, blocks, processing steps, and methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a memory, a processing circuits, logic circuits, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such a parallel processors.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

100: OTP (ONE-TIME PROGRAMMABLE) MEMORY
200: MEMORY PROGRAMMING APPARATUS
210: MEMORY READING UNIT
220: MEMORY WRITING UNIT
222: RE-WRITING PATTERN GENERATING MODULE
224: RE-WRITING PATTERN STORING MODULE
226: VOLTAGE GENERATING MODULE
228: VOLTAGE PROVIDING MODULE
230: ADDRESS DECODING UNIT
240: CONTROL UNIT

What is claimed is:

1. A memory programming apparatus comprising:
a memory reader configured to read a read data in a plurality of cells related with an address of a programmable memory; and
a memory writer configured to
record a write data on the plurality of cells,
compare the write data with the read data,
generate a re-writing pattern,
correct at least one mismatch cell among the plurality of cells, and
generate a mask data based on the read data to generate the re-writing pattern.

2. The apparatus of claim 1, wherein the memory writer further comprises a re-writing pattern storing module configured to store the re-writing patterns.

3. A memory programming apparatus comprising:
a memory reader configured to read a read data in a plurality of cells related with an address of a programmable memory;
a memory writer configured:
to record a write data on the plurality of cells,
to compare the write data with the read data,
to generate a re-writing pattern, and
to correct at least one mismatch cell among the plurality of cells;
a voltage generator configured to generate a fusing voltage; and
a voltage provider configured to provide the fusing voltage to the at least one mismatch cell based on the re-writing pattern.

4. The apparatus of claim 3, wherein the voltage provider further comprises a plurality of switches configured to be controlled based on the re-writing pattern and to provide the fusing voltage to the plurality of cells.

5. A memory programming apparatus comprising:
a memory reader configured to read a read data in a plurality of cells related with an address of a programmable memory;
a memory writer configured:
to record a write data on the plurality of cells,
to compare the write data with the read data,
to generate a re-writing pattern, and
to correct at least one mismatch cell among the plurality of cells, and
a controller configured to count a number of the re-correcting operation and to determine whether the repetition number exceeds a count,
wherein the memory reader is further configured to perform a re-reading operation on a re-read data in the plurality of cells using the address, in response to correcting the mismatch cell,
wherein the memory writer is further configured to update the re-writing pattern using the re-read data to perform a re-correcting operation on at least one re-mismatch cell,
wherein the memory reader and the memory writer sequentially repeat the re-reading operation and the re-correcting operation until an error does not occur in contents recorded on the plurality of cells.

6. The apparatus of claim 5, further comprising:
an address decoder configured to receive a programming data and to extract cell selecting information associated with a specific address of a memory.

7. The apparatus of claim 6, wherein the controller is further configured to enables the address decoder:
to receive the programming data,
to extract different cell selecting information in response to an absence of an error in the contents written on the plurality of cells or the number of operation exceeding the count, and
to update a write data for the address.

8. The apparatus of claim 5, wherein the controller is further configured to control the memory reader, memory writer, and the address decoder based on a clock signal and the re-writing pattern.

9. The apparatus of claim 3, wherein the fusing voltage provided to the plurality of cells varies from 7.5V to 8V.

10. The apparatus of claim 5, wherein the count is varied based on an applied product.

11. A memory programming method comprising:
writing a write data on a plurality of cells related with an address of a programmable memory;
reading a read data in the plurality of cells;
generating a re-writing pattern based on comparison of the write data with the read data to; and
correcting at least one mismatch cell among the plurality of cells,
wherein the generating of the re-writing pattern comprises:
performing an XOR (exclusive OR) operation on the write data and the read data to generate a mask data; and
performing an AND operation on the generated mask data and the write data to generate the re-writing pattern.

12. The memory programming method of claim 11, wherein the writing of the write data comprises testing for an operating parameter before the writing of the write data.

13. The apparatus of claim 1, wherein the memory writer further comprises a re-writing pattern generator configured to perform a logical AND operation between the mask data and the write data to generate the re-writing pattern.

* * * * *